(12) United States Patent
Gillette (10) Patent No.: US 10,756,692 B2
(45) Date of Patent: Aug. 25, 2020

(54) FREQUENCY SELECTIVE CANCELER

(71) Applicant: METAMAGNETICS, Inc., Westborough, MA (US)

(72) Inventor: Scott M. Gillette, Norfolk, MA (US)

(73) Assignee: Metamagnetics, Inc., Westborough, MA (US)

( * ) Notice: Subject to any disclaimer, the term of this patent is extended or adjusted under 35 U.S.C. 154(b) by 57 days.

(21) Appl. No.: 16/223,960

(22) Filed: Dec. 18, 2018

(65) Prior Publication Data

US 2019/0267960 A1    Aug. 29, 2019

Related U.S. Application Data

(60) Provisional application No. 62/634,337, filed on Feb. 23, 2018.

(51) Int. Cl.
*H03G 11/00* (2006.01)
*H03H 2/00* (2006.01)
*H01P 1/38* (2006.01)

(52) U.S. Cl.
CPC ............... *H03H 2/001* (2013.01); *H01P 1/38* (2013.01); *H03G 11/00* (2013.01)

(58) Field of Classification Search
CPC .. H01P 1/38; H01P 1/383; H01P 1/387; H01P 1/39; H01P 1/32; H01P 1/36; H03H 2/001; H03G 11/00; H03G 11/002; H03G 11/006; H03G 11/04; H03G 11/08
USPC ................... 333/1.1, 24.2, 17.2, 81 R, 81 A
See application file for complete search history.

(56) References Cited

U.S. PATENT DOCUMENTS

| | | |
|---|---|---|
| 4,283,692 A | 8/1981 | Adam |
| 6,473,596 B1 | 10/2002 | Stamper et al. |
| 6,937,112 B2 | 8/2005 | Jun et al. |
| 2009/0237173 A1* | 9/2009 | Ziaei ....................... H01P 1/127 333/1.1 |

* cited by examiner

*Primary Examiner* — Stephen E. Jones
(74) *Attorney, Agent, or Firm* — Daly, Crowley, Mofford & Durkee LLP (57) ABSTRACT

Described is a frequency selective canceler, which uses signals reflected from a reflective element (e.g. a frequency selective limiter) to selectively reject only signals having a power level above a threshold power level while simultaneously allowing signals having a power level below the threshold power level to pass without rejection.

20 Claims, 7 Drawing Sheets

FREQUENCY SELECTIVE CANCELER

CROSS-REFERENCE TO RELATED APPLICATIONS

This application claims the benefit of U.S. Provisional Application No. 62/634,337 filed Feb. 23, 2018 which is incorporated by reference herein in its entirety.

GOVERNMENT RIGHTS

This invention was made with Government support under Grant N68335-17-C-0252 from the Office of Naval Air Warfare Center—Aircraft Division. The Government has certain rights in this invention.

TECHNICAL FIELD

This disclosure relates generally to cancelers and more particularly to frequency selective cancelers.

BACKGROUND

As is known in the art, a frequency selective limiter (FSL) is a nonlinear passive device that attenuates radio frequency (RF) signals provided to an input thereof having a power level which is above a predetermined threshold power level. Hence, FSLs are said to limit the amount of power of an RF signal. RF Signals having a power level below the predetermined threshold power, on the other hand, propagate from the FSL input port to the FSL output port substantially unattenuated.

One feature of an FSL is the frequency selective nature of the high-power limiting. Specifically, an FSL has a characteristic such that low power signals (i.e. signals having a power level below the threshold power lever) close in frequency to the limited signals are substantially unaffected (i.e., the FSL does not substantially attenuate such signals).

A typical implementation of an FSL includes a stripline transmission structure provided from two layers of dielectric material disposed about a strip conductor, with the strip conductor having a fixed length and a fixed width along the length of the FSL. Such structures are relatively simple to fabricate and provide adequate magnetic fields to realize a critical power level of approximately 0 dBm when using a single crystal material. One method of reducing the threshold power level is to use a lower-impedance stripline at the cost of degraded return loss. An external matching structure can be used to improve the impedance match, but this technique reduces the bandwidth and increases the insertion loss of the FSL.

SUMMARY

The concepts, systems and techniques disclosed herein are directed toward a frequency selective canceler (FSC) having an ability to reject (or attenuate) signals above a designated power threshold and simultaneously allow below-threshold signals to pass there through without rejection (i.e. without being substantially attenuated).

In an embodiment, the FSC includes a circulator having a first port coupled to an input port of the FSC; a direct signal path comprising a reflective element coupled between a second port of the circulator and a first input port of a combiner. As will become apparent from the description herein, it will be appreciated that such a reflective element is reflective to signals at some frequencies and is not reflective to signals at a desired frequency or within a desired range of frequencies. An output port of the combiner is coupled to the output port of the FSC. The FSC further includes a conditioning signal path coupled between a third port of the circulator and a second input port of the combiner.

With this particular arrangement, a frequency selective canceler capable of rejecting (or attenuating) signals above a designated power threshold while simultaneously allowing signals below the power threshold to propagate therethrough (i.e. from an input of the canceler to an output of the canceler) without rejection (i.e. without being substantially attenuated) is provided.

In embodiments, the reflective element of the FSC may be provided as a frequency selective limiter (FSL). In response to RF signals having a power level above a threshold power level provided to the direct path, the reflective element (e.g. a reflective FSL) reflects or otherwise re-directs the above-threshold portion of the RF signals to the circulator which directs the interfering signals to the conditioning path while allowing signals of interest to pass therethrough.

The conditioning path of the FSC comprises RF amplitude and/or phase control circuitry. In response to signals provided to the input of the conditioning path, the conditioning path adjusts or otherwise sets the phase of the signals propagating therethrough such that the signal has phase which is shifted (e.g. 180 degrees shifted) from like frequency signals propagating in the direct path. For reasons which will become apparent from the description herein below, the conditioning path may also adjust or otherwise set the amplitude of the redirected signal such that the redirected signal has an amplitude which is substantially equal to the amplitude of the like frequency signal in the direct path. Thus, the direct path has propagating therethrough both the signals of interest and interfering signals while the conditioning path has propagating therethrough substantially only the interfering signals.

The outputs of the direct path and conditioning path are coupled such that the interfering signals in each path cancel each other. In embodiments, the outputs of both the direct path and the conditioning path are coupled to inputs of an RF combiner. In response to the interfering signal and the redirected signal being provided to inputs of the RF combiner, the RF combiner combines the signals provided thereto. The RF combiner is provided having a combining characteristic such that in response to equal amplitude, opposite phased signals provided to the inputs thereof, the combiner adds the signals such that they cancel. Thus, in some embodiments, the interfering signal in the direct path and the redirected interfering signal in the conditioning path are provided having substantially the same amplitude and are substantially 180 degrees out of phase such that when the RF combiner combines the signals from the two different paths, the signals substantially cancel each other. Accordingly, only the below-threshold, signals of interest propagate through the RF combiner to the output of the FSC.

In accordance with a further aspect of the concepts described herein, a frequency selective canceler (FSC) comprises a circulator having a first port coupled to an input of the frequency selective canceler, a second port coupled to an input of a direct signal path and a third port coupled to an input port of a conditioning signal path. An output of the direct signal path is coupled to a first input of a combiner circuit and an output of the conditioning signal path is coupled to a second input port of the combiner circuit. An output of the combiner circuit is coupled to an output of the frequency selective canceler. The direct signal path of the FSC comprises a magnetostatic wave frequency selective limiter (MSW FSL), and optionally a tunable attenuator to allow for transmission of below-threshold signals and redirection of above-threshold signal. The conditioning path comprises a tunable phase shifter to adjust or otherwise change the phase of signals propagating therethrough.

In operation, above-threshold signals are reflected or otherwise redirected from the MSW FSL signal path and routed, via the circulator, through the conditioning path comprising of a tunable phase shifter to set the reflected signal at 180 degrees phase shifted as the signal in the direct path. The tunable attenuator in the direct path is used to match the amplitudes of signals propagating in both direct and conditioning paths. A combiner component is used to combine direct path signals with conditioning path signals which results in strong rejection applied to only above-threshold signals while simultaneously allowing below-threshold signals to pass with minimal attenuation.

The FSC may also include a second circulator and a second MSW FSL in the conditioning path to automatically set the signal gain in the conditioning path. In this way, above-threshold signals are reflected by the second MSW FSL and out a third port of the second circulator where the signal can be terminated, interrogated, or otherwise used.

A broadband FSC may also be provided having electrical lengths of direct and conditioning paths selected such that the tunable phase shifter can be replaced with a fixed phase shift component thereby reducing complexity of the canceler.

A passive broadband FSC may be provided such that the power thresholds of MSW FSLs are engineered or otherwise provided with an offset respective to which path they are in, so that no tunable gain component is needed, thereby reducing complexity of the canceler.

Any frequency selective canceler described in accordance with the concepts described herein may provide rejection only to above-threshold signals and may be provided having a power threshold between −80 and +20 dBm.

DESCRIPTION OF DRAWINGS

The details of one or more embodiments illustrating the concepts described herein are set forth in the accompanying drawings and the description below. Other features, objects, and advantages of the concepts, systems and techniques described herein will be apparent from the description and drawings, and from the claims.

Like reference symbols in the various drawings indicate like elements.

DETAILED DESCRIPTION

Described herein are various embodiments of a frequency selective canceler having an ability to reject (or attenuate) signals above a designated power threshold while simultaneously allowing below-threshold signals to pass without rejection (i.e. without being substantially attenuated).

Figure 1:
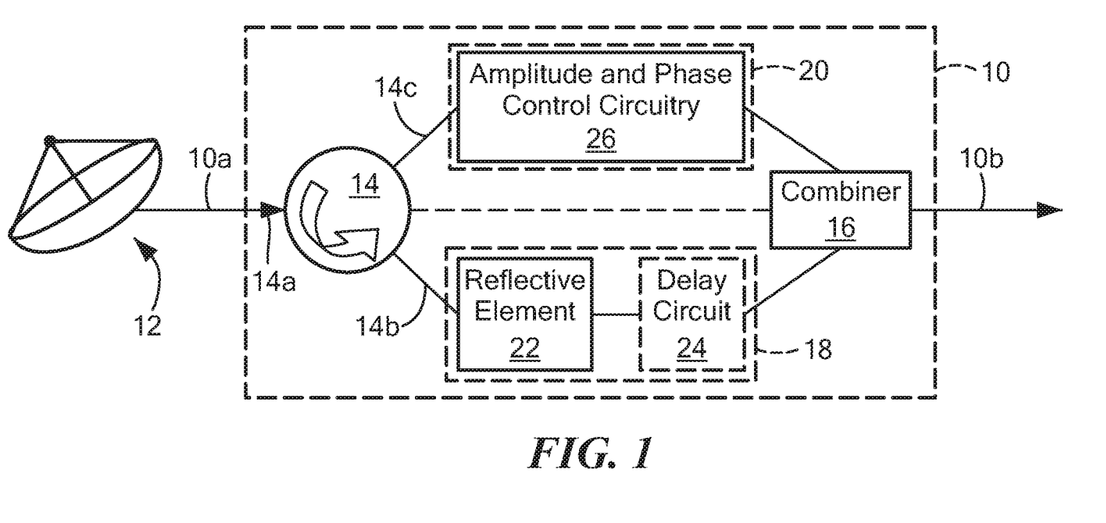
FIG. 1 is a block diagram of a frequency selective canceler (FSC)
Figure 1A:
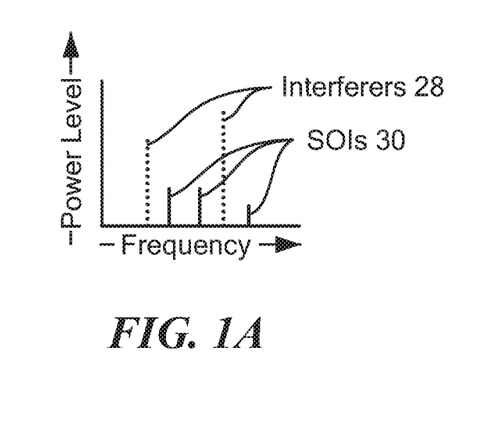
FIG. 1A is a plot of amplitude vs. frequency for signals provided to an input of the frequency selective canceler shown in FIG. 1.
Figure 1B:
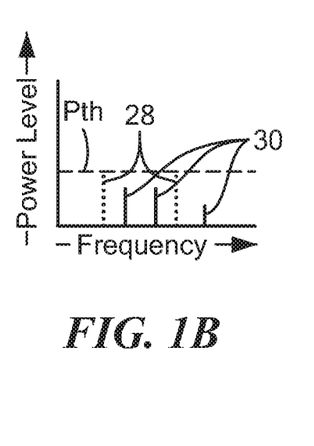
FIG. 1B is a plot of amplitude vs. frequency for signals propagating through a direct path of the frequency selective canceler shown in FIG. 1.
Figure 1C:
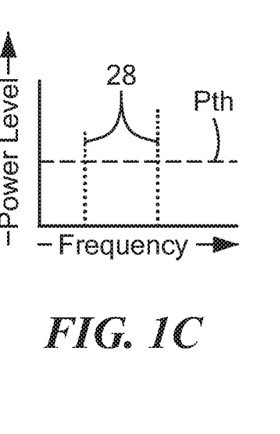
FIG. 1C is a plot of amplitude vs. frequency for signals propagating through a conditioning path of the frequency selective canceler shown in FIG. 1.
Figure 1D:
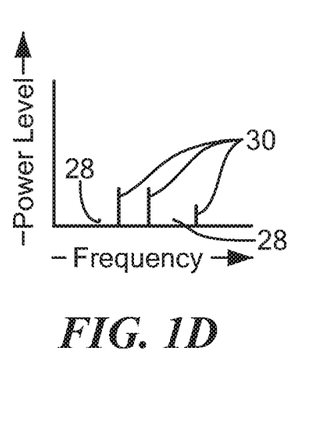
FIG. 1D is a plot of amplitude vs. frequency for signals at an output of the frequency selective canceler shown in FIG. 1.

Referring now to FIGS. 1-1D, a frequency selective canceler (FSC) 10 has an input port 10a configured to receive radio frequency (RF) signals from an RF system, circuit or device and an output port 10b. Here, the input of canceler 10 is shown coupled to an output port of an RF antenna 12 (which is not properly a part of the canceler). It should, of course, be appreciated that the canceler input could be coupled to any system, circuit or device which provides RF signals. Similarly, FSC output 10b may be coupled to any appropriate RF system, circuit or device.

FSC 10 comprises a circulator 14 having a first port 14a coupled to the input port 10a of the FSC, a second port 14b, and a third port 14c. FSC 10 further includes a combiner 16 having first and second input ports and an output port coupled to the FSC output 10b.

FSC 10 also includes a so-called "direct signal path" 18 (or more simply a "direct path") having a first end coupled to the second port of the circulator and a second end coupled to a first one of the first and second input ports of the combiner. FSC 10 further includes so-called "conditioning signal path" 20 (or more simply a "conditioning path") having a first end coupled to the third port of the circulator and a second end coupled to a second one of the first and second input ports of the combiner.

The direct path includes a reflective element 22 and optionally a delay circuit 24. Reflective element 22 may be any circuit element or combination of circuit elements having at least electrical characteristics (e.g. radio frequency characteristics) which may be the same as or similar to that of a reflective frequency selective limiter (FSL). Other reflective elements which may also be used include reflective-type filters, which rely on impedance mismatch to reflect out-of-band signals. Such filters could potentially be configured for use in the canceler to better reject out-of-band signals.

Conditioning path 20 includes amplitude and phase control circuitry 26 and optionally a delay circuit (not shown in FIG. 1).

One or more RF signals, including interfering signals 28 and signals of interest 30 (see FIG. 1A) may be provided to an input of the FSC 10. Thus, the input spectrum contains mix of signals-of-interest (SOIs) and unwanted interferer signals having amplitudes greater than the amplitudes of the signals-of-interest.

As can be seen from FIG. 1A, the interfering signals may, for example, correspond to jammer signals having frequencies which are within the same bandwidth as the signals of interest. Thus, it is not easily possible to filter such interfering signals without also filtering the signals of interest.

The interfering signals and signals of interest are thus coupled to an input of the circulator which directs all such signals toward the direct path. Thus, the direct path has a power spectrum as shown in FIG. 1B for example.

Signals having a power level less than or equal to a threshold power level Pth pass through the direct path while the portions of signals in the direct path having a power level above the threshold power level Pth get split in that power above the threshold power level is reflected by reflective element back through the circulator to conditioning path 20. The reflective element in the direct path thus reflects or otherwise re-directs signals having a power level above a predetermined threshold back toward the circulator.

As can be seen from FIG. 1A, the interferer signals have power levels greater that the power levels of the signals of interest. Thus, the reflective element redirects portions of the interfering signals to the circulator while allowing signals of interest to pass therethrough (since the signals of interest have a power level less than the threshold power level).

In turn, circulator 14 further directs the so-redirected interfering signals 28 to the conditioning path (See FIG. 1C).

The conditioning path comprises RF amplitude and/or phase control circuitry 26 and in response to signals provided thereto, the conditioning path adjusts or otherwise sets the phase of the re-directed interfering signals such that the re-directed interfering signals are provided having a phase which is 180 degrees shifted from the interfering signals propagating in the direct path.

For reasons which will become apparent from the description herein below, the conditioning path may also adjust or otherwise set the amplitude of the redirected signal such that the redirected interfering signals have an amplitude which is substantially equal to the amplitude of the interfering signal propagating in the direct path. Thus, the direct path has propagating therethrough both the signals of interest and interfering signals while the conditioning path has propagating therethrough the interfering signals.

The outputs of both the direct path and the conditioning path are coupled to respective inputs of the RF combiner 16. In response to the interfering signal and the redirected signal being provided to the inputs thereof, the RF combiner combines the signals provided thereto.

In this illustrative embodiment, the RF combiner is provided having a combining characteristic such that in response to equal amplitude, opposite phased signals provided to the inputs thereof, the combiner adds the signals such that they cancel. Thus, since the interfering signal and the redirected signal are provided having substantially the same amplitude and are substantially 180 degrees out of phase, when the RF combiner combines the two signals, the signals substantially cancel each other.

Accordingly, as illustrated in FIG. 1D, only the signals of interest substantially propagate through the RF combiner to the output 10b of the FSC (i.e. the interferer signals are nulled and only the SOIs remain.

It can now be understood that with the above arrangement, above-threshold signals are attenuated while below-threshold signals are unaffected. Thus, the FSC automatically discriminates based upon power level.

It should be appreciated that to promote clarity in the description of the broad concepts sought to be protected herein, in the illustrative embodiment of FIG. 1, the RF combiner is provided having a combining characteristic such that equal-amplitude, equal-phase signals provided to respective ones of the combiner inputs constructively add at the combiner output while equal-amplitude, opposite-phase signals provided to respective ones of the combiner inputs cancel at the combiner output.

However, as should now be apparent to one of ordinary skill in the art after reading the description provided herein, the combiner may also be provided having different characteristics (e.g. combiner may be provided having the characteristic of a so-called hybrid (or 90 degree) coupler or a so-called magic Tee coupler. Use of such alternate circuits will require proper phasing of the so-called "interfering signals" propagating in the direct and conditioning signal paths. That is, in some embodiments, depending upon the characteristics of the combiner 16, it may be desirable or even necessary to provide the interfering signal and the redirected signal having amplitude and phase relationships other than equal (or substantially equal) amplitudes and/or 180 degrees (or substantially 180 degrees) out of phase. Rather, it is desirable that the interfering signal and the redirected signal are provided having amplitude and phase relationships which result in a cancelation when the two signals are combined in an RF combiner circuit.

Figure 2:
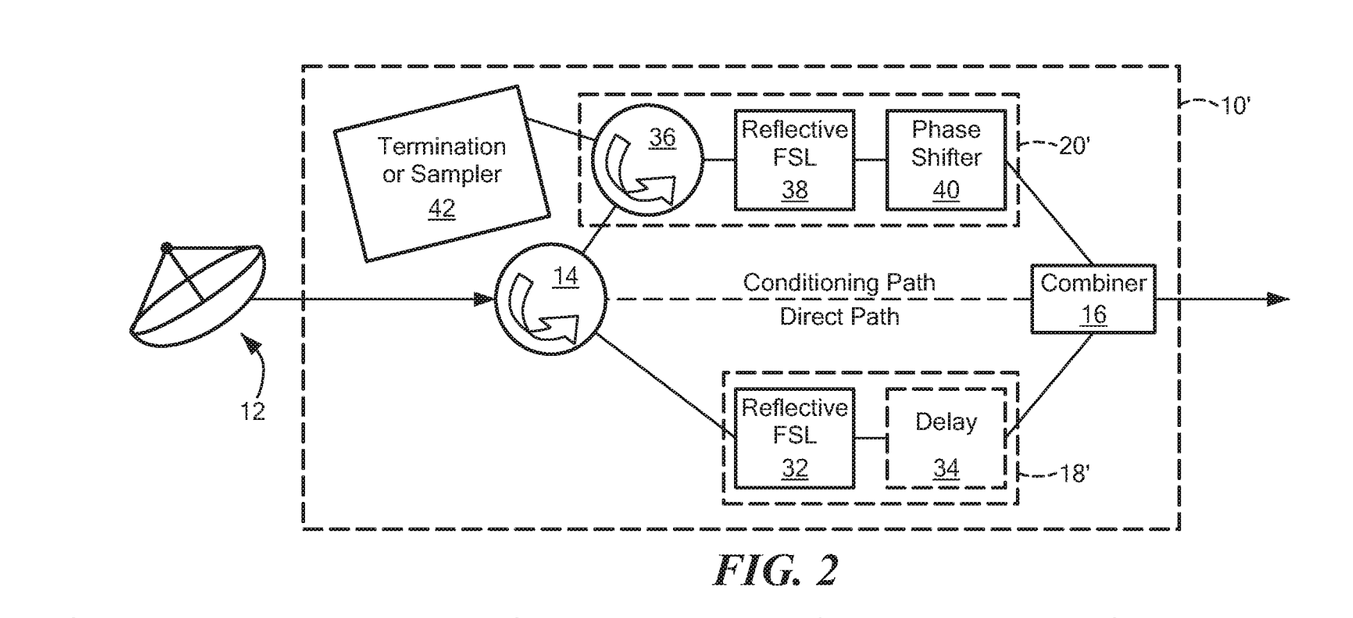
FIG. 2 is a block diagram of an alternate embodiment of a frequency selective canceler.
Figure 2A:
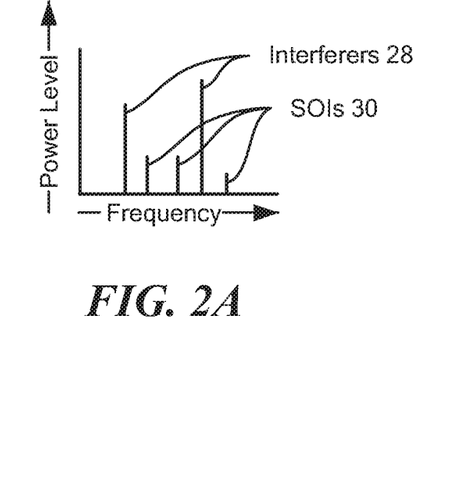
FIG. 2A is a plot of amplitude vs. frequency for signals provided to an input of the frequency selective canceler shown in FIG. 2.
Figure 2B:
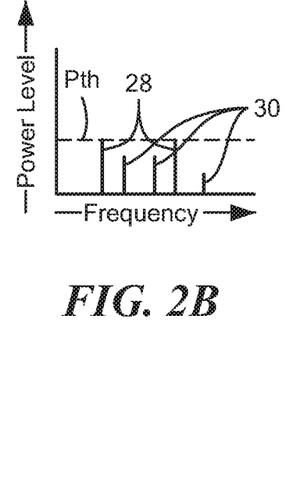
FIG. 2B is a plot of amplitude vs. frequency for signals propagating through a direct path of the frequency selective canceler shown in FIG. 2.
Figure 2C:
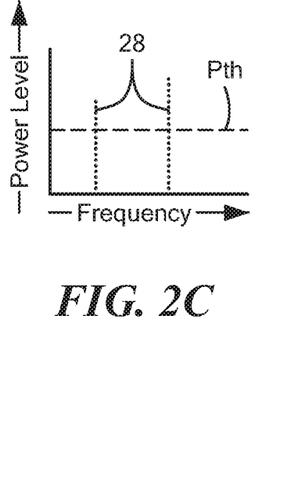
FIG. 2C is a plot of amplitude vs. frequency for signals propagating through a conditioning path of the frequency selective canceler shown in FIG. 2.
Figure 2D:
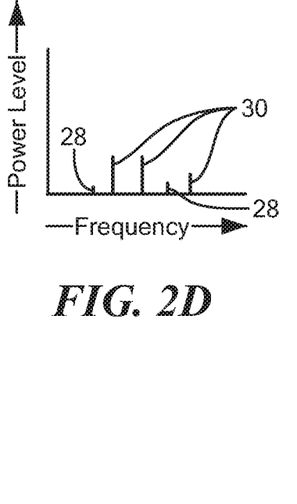
FIG. 2D is a plot of amplitude vs. frequency for signals at an output of the frequency selective canceler shown in FIG. 2.

Referring now to FIG. 2 in which like elements of FIG. 1 are provided having like reference designations, the direct path 18' of a frequency selective canceler 10' comprises a reflective FSL 32 and an optional delay circuit 34 while the conditioning path 20' includes a circulator 36, a reflective FSL 38 and an optional phase shifter 40. Ideally, the reflective FSLs 32, 38 in the respective direct and conditioning paths should have matched characteristics.

As described above in conjunction with FIG. 1, signals having a power level below the threshold set by the direct path FSL propagate through the direct path 18' while portions of above threshold signals are reflected by the direct FSL though circulator 14 to an input of circulator 36 in conditioning path 20'. Circulator 36 couples signals to an input of reflective FSL 38. Once again, FSL 38 operates to pass signals having a power level below a threshold set by the conditioning path FSL while above threshold signals are reflected by the conditioning path FSL 38.

Signals reflected from FSL 38 back toward circulator 36 are directed by circulator to a port which may be coupled to another circuit element 42 which may be provided, for example, as a termination or another circuit such as sampling circuit for further processing.

Figure 3:
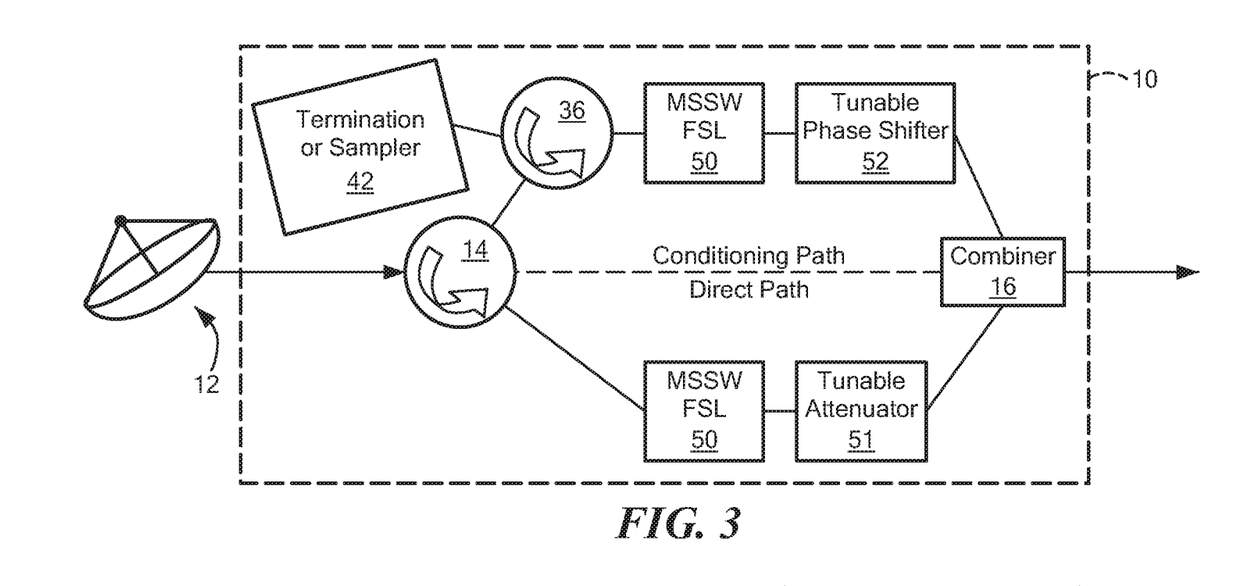
FIG. 3 is a block diagram of an alternate embodiment of a frequency selective canceler.
Figure 3A:
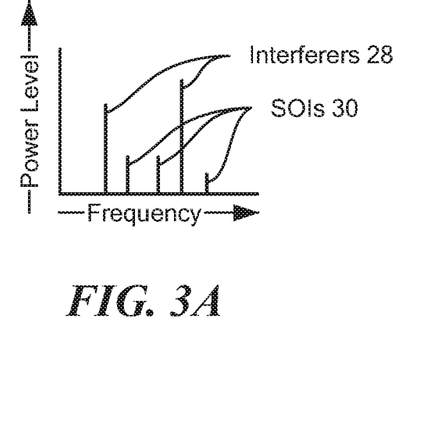
FIG. 3A is a plot of amplitude vs. frequency for signals provided to an input of the frequency selective canceler shown in FIG. 3.
Figure 3B:
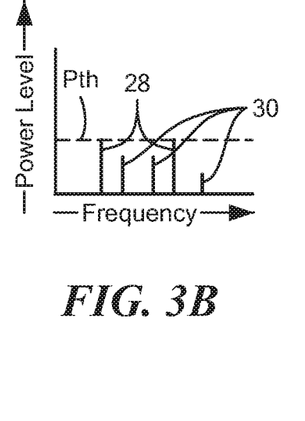
FIG. 3B is a plot of amplitude vs. frequency for signals propagating through a direct path of the frequency selective canceler shown in FIG. 3.
Figure 3C:
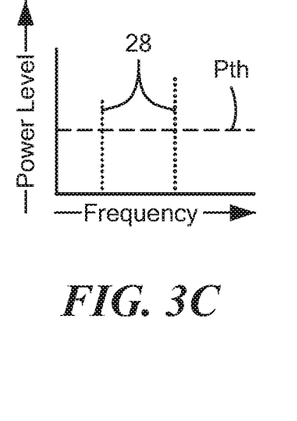
FIG. 3C is a plot of amplitude vs. frequency for signals propagating through a conditioning path of the frequency selective canceler shown in FIG. 3.
Figure 3D:
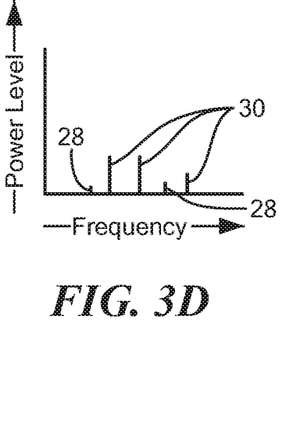
FIG. 3D is a plot of amplitude vs. frequency for signals at an output of the frequency selective canceler shown in FIG. 3.

Referring now to FIG. 3 in which like elements of FIGS. 1 and 2 are provided having like reference designations, the direct path 18" of a frequency selective canceler 10' comprises a magnetostatic wave frequency selective limiter (MSW FSL) 50 and an optional tunable attenuator 51 while the conditioning path 20" includes a circulator 36, an MSW FSL 50 and an optional tunable phase shifter 52. Ideally the characteristics of MSW FSLs 50 are matched. In embodiments, the MSW FSL may be provided as a magnetostatic surface wave (MSSW) FSL.

The matched MSW FSL and tunable phase shifter 52 set interferers propagating in the conditioning path at equal amplitude and opposite phase as those in direct path.

Again, the conditioning path MSW FSL reflects the portion of a signal above a selected power level Pth back into circulator 36 where the signal is terminated or sampled, for example.

In embodiments, the FSC protects a device (e.g. a receiver, for example) by selectively attenuating only above-threshold signals down to the device's power threshold (i.e. down to a power level within the acceptable operating range of the receiver or other device).

Figure 4:
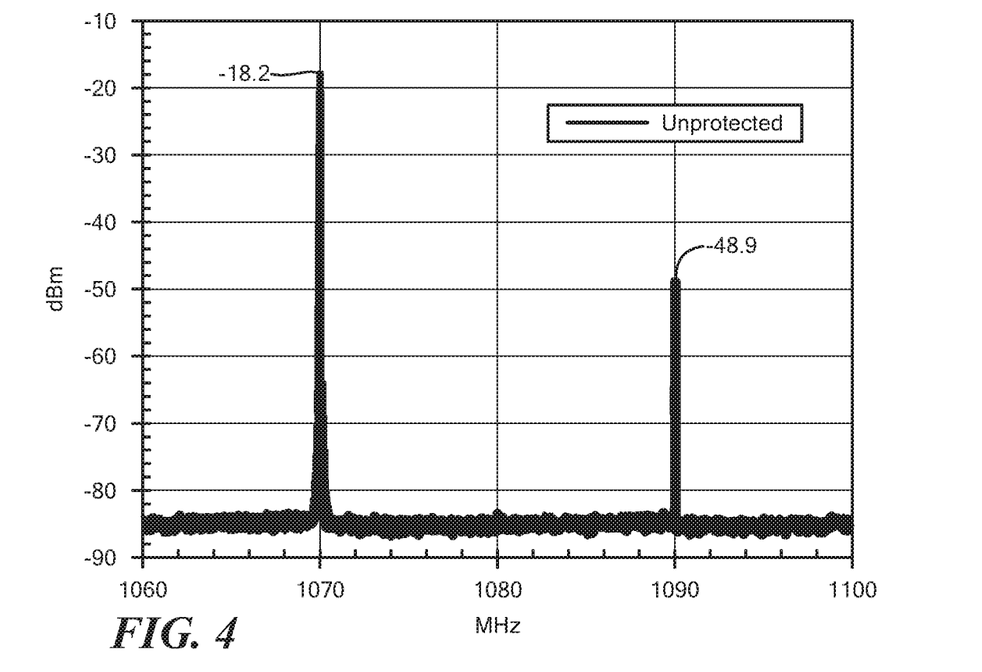
FIGS. 4-4B are a series of plot of amplitude vs. frequency for output signals from three different circuits.
Figure 4A:
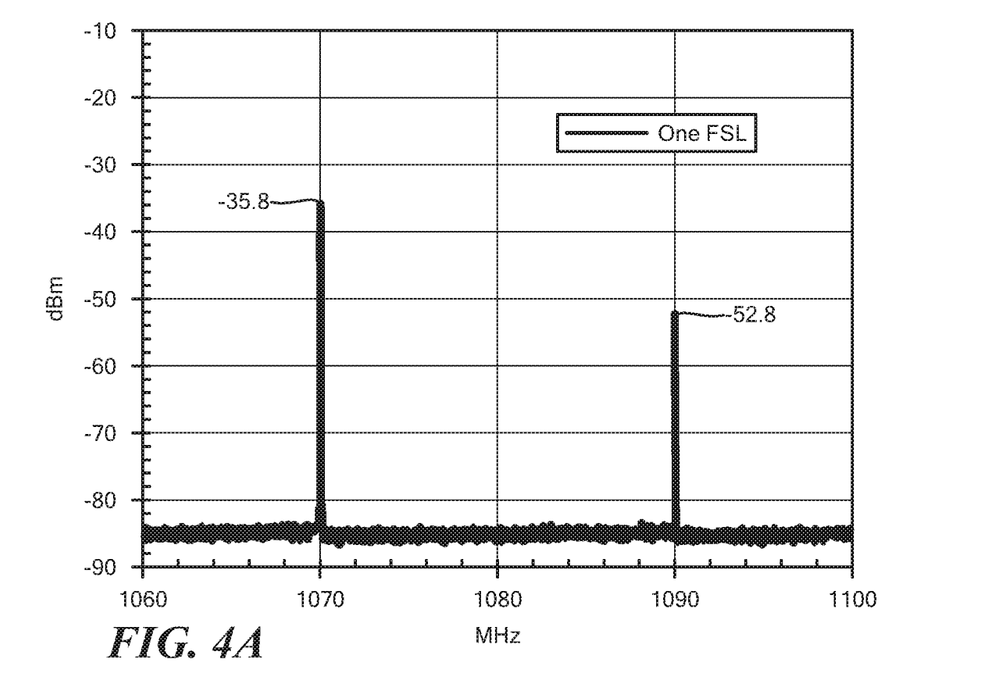
Figure 4B:
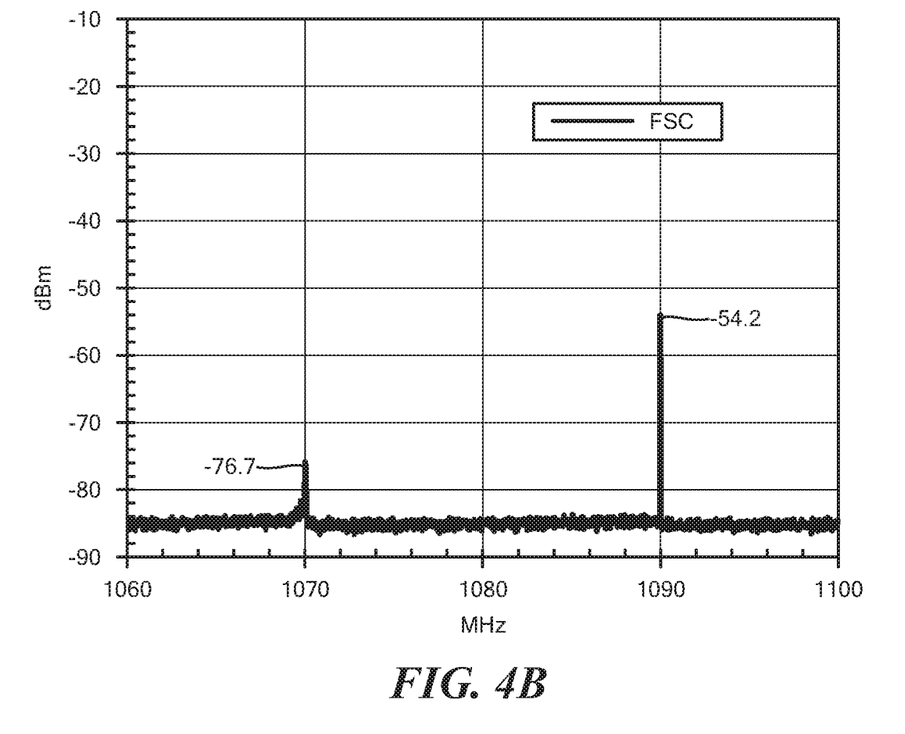

Referring now to FIGS. 4-4C, in one illustrative embodiment, a signal of interest (SOI) has a frequency of 1090 MHz and a continuous wave (CW) interferer has a frequency of 1070 MHz. As shown in FIG. 4, the SOI has a signal level of −48.9 dB and the CW interferer has a signal level of −18.2 dB, respectively with no protection in place. As can be seen by comparing the curves in FIGS. 4 and 4A, a FSL alone attenuates the CW interferer by greater than 15 dB (e.g. from −18.2 dB to −35.8 dB) and the SOI is reduced by about 4 dB (i.e. the SOI experiences about 4 dB of insertion loss from −48.9 dB to −52.8 dB). However, as can be seen by comparing the curves in FIGS. 4 and 4B, the FSC attenuates the CW interferer by greater than 50 dB (e.g. from −18.2 dB to −76.7 db) and the SOI is reduced by about 5 dB (i.e. there is about 5 dB of insertion loss from −48.9 dB to −54.2 dB). Thus, the use of an FSC provided in accordance with the concepts described herein results in an SOI having a signal level amplitude which is greater than the signal level amplitude of a CW interferer.

Figure 5:
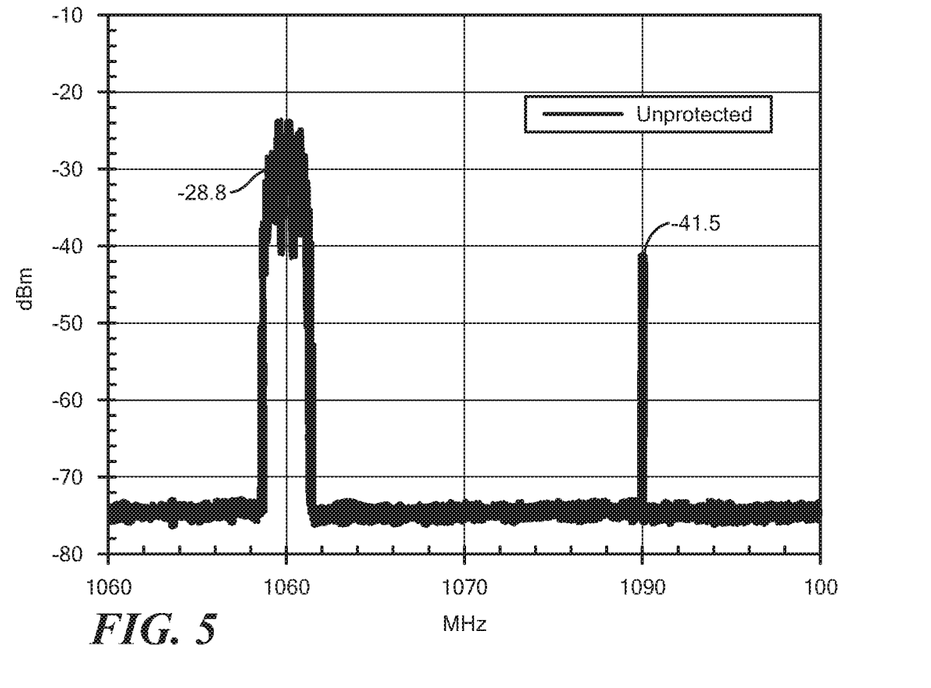
FIGS. 5-5B are a series of plots of amplitude vs. frequency for output signals from three different circuits.
Figure 5A:
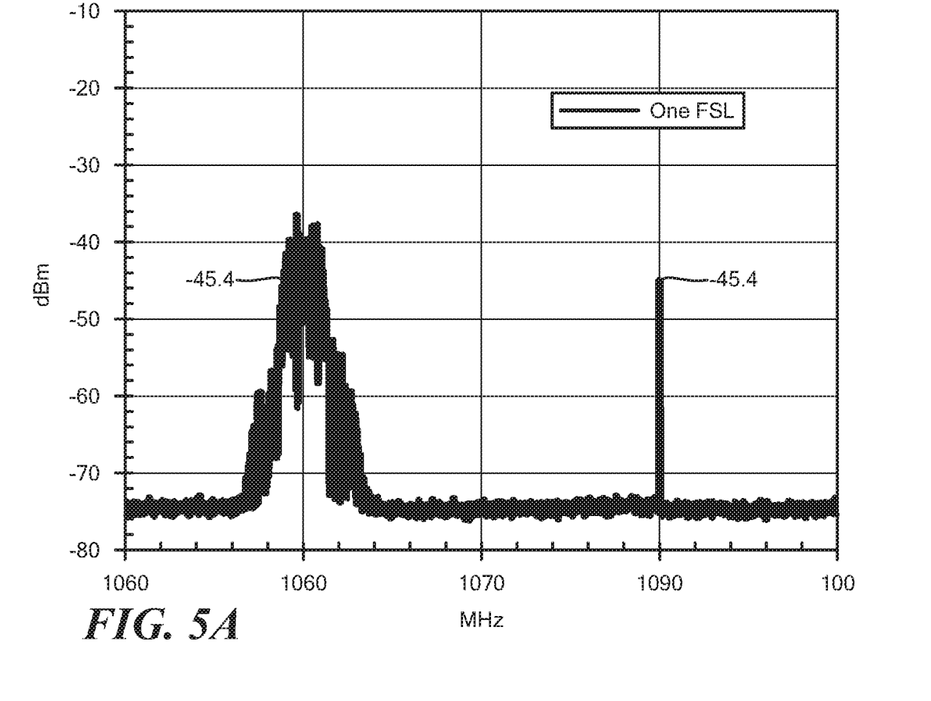
Figure 5B:
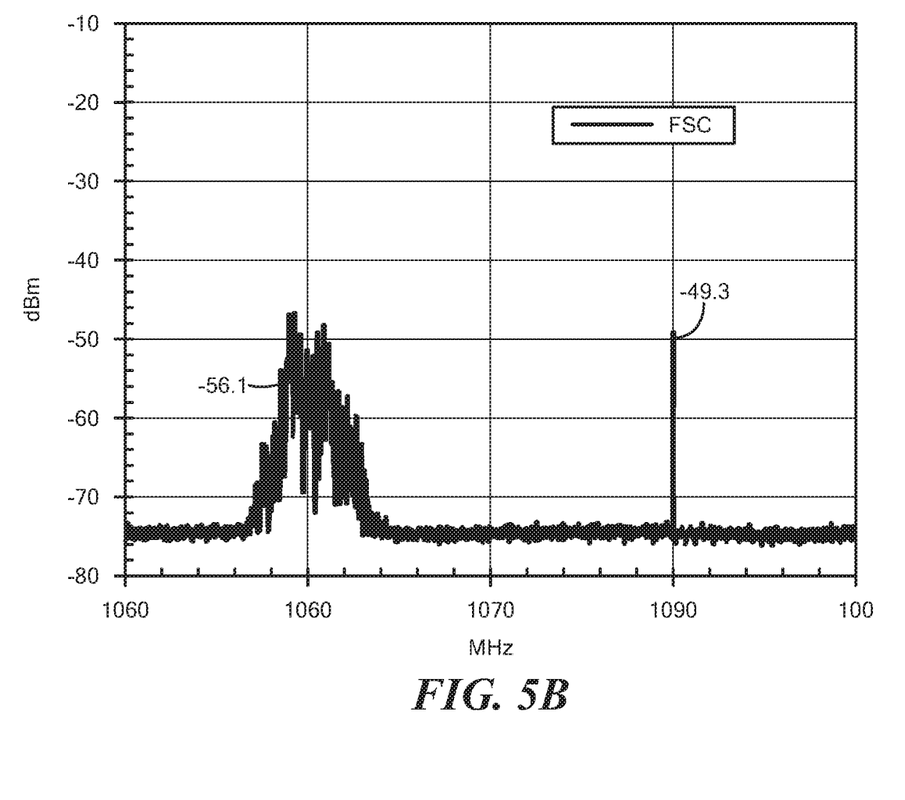

Referring now to FIGS. 5-5B, in another illustrative embodiment, an SOI has a frequency of about 1090 MHz and a CW interferer has a center frequency (CF) of about 1070 MHz with quadrature phase shift key modulation (QPSK) of 2000 MS/s. As shown in FIG. 5, the SOI has a signal level of −41.5 dB and the CW interferer has a signal level of −28.8 dB, respectively with no protection in place. As can be seen from a comparison of FIGS. 5 and 5A, an FSL alone attenuates the modulated interferer by greater than 10 dB (e.g. from −28.8 dB to −45.4 db) and the SOI is reduced by about 4 dB (i.e. 4 dB of insertion loss—e.g. from −41.5 dB to −45.4 dB). However, as can be seen by comparing the curves in FIGS. 5 and 5B, an FSC provided in accordance with the general concepts described herein attenuates the modulated interferer by greater than 20 dB (e.g. from −28.8 dB to −56.1 db) and the SOI is reduced by about 8 dB (i.e. 8 dB of insertion loss—e.g. from −41.5 dB to −49.3 dB). Thus, the use of an FSC provided in accordance with the concepts described herein results in an SOI having a signal level amplitude which is generally greater than a signal level amplitude of a modulated interferer.

Having described preferred embodiments, which serve to illustrate various concepts, structures and techniques, which are the subject of this patent, it will now become apparent that other embodiments incorporating these concepts, structures and techniques may be used. For example, it is possible to provide FSCs which comprise one or more MSW FSLs with impedance matching networks. This may be desirable since unmatched devices may have relatively narrow frequency bandwidths which could result in undesired effects in an FSC.

Furthermore, in some applications it may be desirable or necessary to provide an FSC having dissimilar signal path lengths between the direct and conditioning paths which can result in uneven phase shift thereby resulting in narrow band cancelling. In such applications it may be desirable to develop an FSC on single printed circuit board having relatively short electrical path lengths so as to reduce, and ideally minimize, such path length differences.

Also, it may be desirable or necessary to incorporate MSW FSLs having electrical/RF response characteristics which depend upon path. For example, the conditioning path may need an FSL having a power threshold Pth which is lower than the power threshold $R_{th}$ than the direct path FSL to make up for losses through circulators and interconnects.

Furthermore, phase dispersion with power needs to be matched for FSLs in the direct and conditioning paths.

Also, auto-tuning of a phase shifter and an attenuator may be accomplished using feedback from an extra circulator port. It may also be desirable to expand a bandwidth over which a phase angle is matched so that the FSC can remain passive.

Also, in some embodiments, it may be desirable or necessary to utilize a phase shifter which is a "true" phase shifter (i.e. a phase shifter which provides only a phase shift as opposed to a time-delay originated phase shift). This approach may be important, for example, for cancelling modulated signals that have strong time-dependent characteristics. It is, however, appreciated that in a continuous wave (CW) system (i.e. applications which utilize non-modulated waveforms) phase shifters have either characteristic should be suitable for system operation.

Thus, it is clear that other embodiments, not specifically described herein are also contemplated and are within the scope of the concepts taught herein.

Accordingly, it is submitted that the scope of the patent should not be limited to the described embodiments but rather should be limited only by the spirit and scope of the following claims.

What is claimed is:

1. A frequency selective canceler comprising:
   a circulator having a first port coupled to an input of the frequency selective canceler;
   a direct path coupled to a second port of the circulator;
   a conditioning path coupled to a third port of said circulator;
   wherein said direct path comprises a frequency selective limiter (FSL) to allow for transmission of below-threshold signals and redirection of above-threshold signals such that above-threshold signals are reflected off the FSL and routed, using the circulator, through the conditioning path wherein the conditioning path comprises a tunable phase shifter to set the reflected signal at 180 degrees phase shifted as the signal in the direct path; and
   a combiner having a first input coupled to the direct path and a second input coupled to the conditioning path.

2. The canceler of claim 1 wherein the FSL is provided as a magnetostatic wave frequency selective limiter (MSW FSL).

3. The frequency selective canceler of claim 1 where the combination of the phases in the direct path, the conditioning path and the combiner provides the frequency selective canceler with ability to reject signals above a designated power threshold and simultaneously allow for below-threshold signals to pass without rejection.

4. The frequency selective canceler of claim 1 further comprising a tunable attenuator disposed in the direct path and configured to match the amplitudes of signals in both the direct and conditioning paths.

5. The frequency selective canceler of claim 1 wherein the combiner is configured to combine direct path signals with conditioning path signals which results in rejection of only above-threshold signals while simultaneously allowing below-threshold signals to pass.

6. A frequency selective canceler described in claim 1 that provides rejection only to above-threshold signals and has a power threshold between −80 dBm and 0 dBm.

7. The frequency selective canceler of claim 1 wherein the conditioning path further comprises a second circulator and an FSL to automatically set the signal gain in the conditioning path.

8. The frequency selective canceler of claim 7 wherein above-threshold signals are reflected by the second FSL and out a third port of the second circulator where the signal can be terminated, interrogated, or otherwise used.

9. The frequency selective canceler of claim 8 wherein the electrical lengths of direct and conditioning paths are minimized so that a tunable phase shifter can be replaced with a fixed phase shift component, thereby reducing complexity and providing a broadband canceler.

10. The frequency selective canceler of claim 9 wherein the power thresholds of the FSLs are engineered with an offset respective to which path they are in, so that no tunable gain component is needed thereby reducing complexity.

11. The frequency selective canceler of claim 9 wherein the FSL is provided as a magnetostatic FSL.

12. A frequency selective canceler having an input and an output, the frequency selective canceler comprising:
a circulator;
a magnetostatic wave frequency selective limiter (MSW FSL);
an attenuator disposed in a direct path of the canceler to allow for transmission of below-threshold signals and redirection of above-threshold signals such that above-threshold signals are reflected off the MSW FSL and routed, using said circulator, through a conditioning path
wherein said conditioning path comprises a phase shifter such that in response to signals provided thereto, said phase shifter sets the phase of a reflected signal provided thereto at a predetermined phase relative to a signal in the direct path;
where said attenuator is disposed in the direct path and is configured to adjust the amplitudes of signals in both the direct and the conditioning paths; and
a combiner component configured to combine signals from the direct path with signals from said conditioning path such that a rejection of only above-threshold signals occurs while simultaneously allowing below-threshold signals to pass with minimal attenuation between the input and output of the frequency selective canceler.

13. The frequency selective canceler of claim 12 wherein said attenuator is provided as a tunable attenuator.

14. The frequency selective canceler of claim 12 wherein said phase shifter is provided as a tunable phase shifter.

15. The frequency selective canceler of claim 12 wherein:
said attenuator is provided as a tunable attenuator;
said phase shifter is provided as a tunable phase shifter; and
in response to signals provided thereto said tunable attenuator and tunable phase shifter operate such that the phase of a reflected signal provided thereto is 180 degrees phase shifted relative to a signal in the direct path and signals in both the direct and the conditioning paths are provided having substantially equal amplitudes.

16. The canceler of claim 12 wherein the circulator is a first circulator coupled to the direct path and the MSW FSL is a first MSW FSL disposed in the direct path and the canceler further comprises a second circulator and a second MSW FSL disposed in said conditioning path to automatically set the signal gain in the conditioning path such that in response to above-threshold signals reflected by the second MSW FSL and out a third port of the second circulator, the signal can be terminated, interrogated, or otherwise used.

17. The frequency selective canceler of claim 16, wherein first and second power thresholds of the respective first and second MSW FSLs are provided having respective first and second offsets, and wherein the respective first and second offsets are selected based upon the path in which the first and second MSW FSLs are disposed.

18. The frequency selective canceler of claim 12 wherein electrical lengths of said direct and conditioning paths are selected such that said phase shifter provides a fixed phase shift to signals provided thereto.

19. The frequency selective canceler of claim 18 wherein said attenuator is provided as a tunable attenuator.

20. The frequency selective canceler of claim 18 wherein said attenuator is provided as a fixed attenuator.

* * * * *